(12) United States Patent
Shivaram et al.

(10) Patent No.: US 7,973,602 B2
(45) Date of Patent: Jul. 5, 2011

(54) VARIABLE GAIN AMPLIFIER

(75) Inventors: Krishna Shivaram, Torrance, CA (US);
Kashif A. Ahmed, Irvine, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 7 days.

(21) Appl. No.: 12/387,826

(22) Filed: May 6, 2009

(65) Prior Publication Data
US 2010/0283543 A1    Nov. 11, 2010

(51) Int. Cl.
*H03F 3/45* (2006.01)
(52) U.S. Cl. ......... 330/254; 330/279; 330/302; 330/310
(58) Field of Classification Search .................... 330/86, 330/133, 260, 278, 279, 282, 284, 302
See application file for complete search history.

(56) References Cited

U.S. PATENT DOCUMENTS

| | | |
|---|---|---|
| 4,864,649 A | 9/1989 | Tajima et al. |
| 5,019,769 A | 5/1991 | Levinson |
| 5,383,208 A | 1/1995 | Queniat et al. |
| 5,471,501 A | 11/1995 | Parr et al. |
| 5,491,548 A | 2/1996 | Bell et al. |
| 5,710,660 A | 1/1998 | Yamamoto et al. |
| 6,720,826 B2 | 4/2004 | Yoon |
| 6,828,857 B2 | 12/2004 | Paillet et al. |
| 7,233,206 B2 * | 6/2007 | Murakami et al. ............ 330/278 |
| 7,403,064 B2 * | 7/2008 | Chou et al. .................... 330/9 |
| 7,741,908 B2 * | 6/2010 | Furuta ........................... 330/253 |
| 2004/0095976 A1 | 5/2004 | Bowler et al. |
| 2004/0240041 A1 | 12/2004 | Tian et al. |
| 2005/0024142 A1 | 2/2005 | Sowlati |
| 2006/0125557 A1 | 6/2006 | Manstretta |
| 2006/0261893 A1 | 11/2006 | Chiang |
| 2008/0055005 A1 | 3/2008 | Nam et al. |

FOREIGN PATENT DOCUMENTS

| | | |
|---|---|---|
| EP | 0606161 | 4/2000 |
| JP | 2001-119250 | 4/2001 |

OTHER PUBLICATIONS

Garth Nash, "AN535 Application Notes-Phase-Locked Loop Design Fundamentals", Motorola, Inc., 1994, 3 pages.
Ron Bertrand, "The Basics of PLL Frequency Synthesis", Online Radio & Electronics Course, Apr. 2002, 9 pages.

* cited by examiner

*Primary Examiner* — Khanh V Nguyen
(74) *Attorney, Agent, or Firm* — Weide & Miller, Ltd.

(57) ABSTRACT

Various amplifier configurations having increased bandwidth, linearity, dynamic range, and less distortion are shown and disclosed. To increase bandwidth in a transimpedance amplifier, a replica circuit is created to replicate a degeneration resistance, or the resistance or value that relates to a feedback resistance. From the replica circuit, the replicated values are mirrored and processed to control a FET switch which modifies a degeneration resistance. The FET switch control signal is related to the feedback resistance and modifies the degeneration resistance to thereby maintain the product of the feedback resistance and the degeneration resistance as a constant. In another embodiment, a second switch controlled by an automatic gain control signal is established between a first stage amplifier and a second stage amplifier to improve dynamic range and bandwidth without degrading other amplifier specifications.

18 Claims, 6 Drawing Sheets

VARIABLE GAIN AMPLIFIER

FIELD OF THE INVENTION

The invention relates to transimpedance amplifiers and in particular to a method and apparatus for increasing dynamic range, linearity, and stability of a transimpedance amplifier.

RELATED ART

Figure 1:
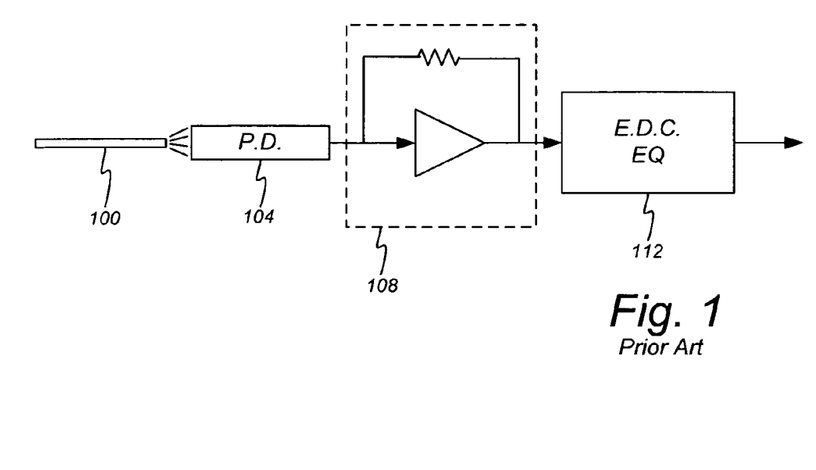
FIG. 1 is a block diagram of a prior art optical receiver front end having an amplifier and an equalizer.

FIG. 1 illustrates an example environment of use. In this example environment, an optical fiber 100 provides an optical signal to a photodetector 104. The photodetector 104 converts the optical signal to a low power electrical current. To facilitate downstream processing the resulting electrical signal must be amplified. The output from the photodetector 104 feeds into an amplifier 108, which increases the power level of the input to a level suitable for downstream processing and decoding. One type of amplifier often utilized for this application is a transimpedance amplifier (TIA), which is a low noise current to voltage amplifier.

The output of the amplifier 108 feeds into an equalizer 112. In this configuration the equalizer 112 comprises an electronic dispersion compensation (EDC) equalizer configured to correct for known signal dispersion within the fiber. As is understood in the art, at certain transmit rates, optical signals traversing fiber optics suffer from known dispersion, which distorts the transmitted signal. The EDC equalizer is configured with a transfer function inverse to that of the optical fiber to thereby reverse the effects of the fiber.

For the equalizer 112 to accurately reverse the dispersive effects of the fiber channel, it is essential for the signal presented to the equalizer to be an accurate amplification of the signal from the fiber 100. As a result, it is essential for the amplifier 108 to have excellent linearity, avoid clipping, and otherwise be free from unwanted distortion. The equalizer is primarily configured to combat dispersion and as a result, distortion introduced by the amplifier 108 can not be corrected by the equalizer.

While prior art amplifiers performed acceptably at lower rates, such as rates in 1 to 2 gigabit per second transmit range, as transmit rates increase, prior art amplifiers suffered from increased non-linearity and distortion. As a result, there is a need in the art for a linear and non-distorting TIA amplifier for high rate applications.

SUMMARY

To overcome the drawbacks in the prior art, disclosed herein is an amplifier having an input configured to receive an input signal and having a degeneration resistance. The amplifier also includes an amplifier feedback loop configured to receive a control signal such that the control signal controls the feedback resistance which in turn controls the gain of the amplifier. Also part of this embodiment is a replica circuit configured to replicate the amplifier and amplifier feedback loop to thereby create a feedback resistance in the replica circuit. A replica circuit feedback loop configured to alter the degeneration resistance in relation to the feedback resistance in the replica circuit.

The replica circuit may be a scaled version of the amplifier and the feedback loop. In one embodiment, the control signal comprises an automatic gain control signal. The amplifier may comprise a transimpedance amplifier. A current mirror may be part of the replica circuit feedback loop. It is further contemplated that the amplifier feedback loop may further comprise a FET switch configured to receive the control signal and the replica circuit feedback loop further comprises a FET switch configured to alter the degeneration resistance in relation to the feedback resistance in the replica circuit.

Also disclosed herein is a method for maintaining linearity in an amplifier comprising receiving an input signal at an input of an amplifier and then amplifying the input signal with the amplifier. In this embodiment the amplifier further comprises a feedback resistance and a degeneration resistance. This method then creates a feedback resistance in a replica circuit such that the replica circuit is a replica of the amplifier and the feedback resistance. For example, in one embodiment in the replica circuit, the feedback resistance may comprise a ratio or be related to the feedback resistance in the amplifier. This method creates a degeneration resistance control signal based on the feedback resistance in the replica circuit and then providing the degeneration resistance control signal to a degeneration resistance control device in the amplifier to thereby control the degeneration resistance in the amplifier.

In one embodiment, the ratio comprises 1 to 1. In one embodiment, the degeneration resistance control device comprises a FET switch. It is contemplated that the method may further comprise a current mirror configured to create the degeneration resistance control signal. In one embodiment, the feedback resistance comprises resistance from a FET switch resistance and a feedback resistor. The amplifier may have the bandwidth to support data rates of 10 gigabit per second or greater.

Another transimpedance amplifier is disclosed wherein the TIA comprises a variable gain amplifier configured to receive and amplify a signal, wherein the gain is set by a gain control signal which modifies a feedback resistance. A replica circuit is also provided and configured to create a replica circuit feedback resistance which is a ratio of the feedback resistance of the variable gain amplifier. An amplifier amplifies a resistance control signal such that the resistance control signal is based on the replica circuit feedback resistance. Also part of this embodiment is a resistance control device configured to change a degeneration resistance in the variable gain amplifier. The degeneration resistance is changed in relation to the feedback resistance in the variable gain amplifier based on the resistance control signal.

The replica circuit replicates one or more aspects of the variable gain amplifier. In one embodiment, the resistance control device comprises a FET switch. In operation, changing the degeneration resistance in relation to the feedback resistance in the variable gain amplifier comprises maintaining the product of the degeneration resistance and the feedback resistance in the variable gain amplifier as generally constant.

Also disclosed herein is a transimpedance amplifier comprising an input configured to receive an input signal and an amplifier configured to amplify the input signal to create an amplified signal. The amplifier also has an output configured to output the amplified signal. A feedback loop having a feedback resistance is part of the system and it has a feedback resistance comprising a switch resistance, a feedback resistor in parallel with the switch resistance, and a divider element. The divider element is in parallel with the feedback resistance and is in series with the switch resistance to create a combined switch resistance. The divider element reduces the effect of changes in the switch resistance on the combined resistance.

In one embodiment the divider element comprises a resistance. The switch resistance may comprise the resistance of a FET switch and the switch resistance may change with an input voltage to the FET switch. It is contemplated that the TIA amplifier may further comprise a detection circuit configured to provide a gain control signal to the FET switch.

Also disclosed is an amplifier having improved performance characteristics. In this configuration, a first stage amplifier has one or more first stage inputs and one or more first stage outputs and a second stage amplifier has one or more second stage inputs and one or more second stage outputs. The one or more second stage inputs connect to the one or more first stage outputs. Also part of this configuration are one or more impedance matching devices at the output of one or more of the first stage amplifier and second stage amplifier. The one or more impedance matching devices have impedance controlled by one or more control signals. A detection system is also provided and configured to monitor an input to the first stage amplifier input or an amplified signal from the first stage amplifier or the second stage amplifier and generate, based on the monitoring, one or more control signals to control the resistance of the one or more impedance matching devices.

In one embodiment the amplifier further comprises a feedback resistor between a second stage input and a second stage output. The impedance matching devices may comprise FET switches. It is contemplated that the one or more impedance matching devices may comprise a first impedance matching device between the first stage amplifier and a second stage amplifier and a second impedance matching device at the one or more second stage outputs. The one or more impedance matching devices adjust the impedance between the first stage amplifier and the second stage amplifier.

Also disclosed is a two stage amplifier comprising a first stage amplifier and a second stage amplifier. In this configuration the output of the first stage amplifier connects to the input of the second stage amplifier. A variable impedance matching device is located between the first stage amplifier and the second stage amplifier such that the variable impedance matching device has an impedance controlled by a control signal received by the variable impedance matching device. A detection circuit is also provided and is configured to detect a peak power level or average power level from a signal output from the two stage amplifier and based on the detection, generate the control signal.

The variable impedance matching device may comprise a FET switch. In one embodiment, the second stage amplifier has differential inputs and the FET switch is connected between the differential inputs and the control signal changes the resistance of the FET switch. The amplifier may further comprise a second variable impedance matching device at the output of the second stage amplifier and the detection circuit further outputs a second control signal to the second variable impedance matching device. In one configuration the amplifier further comprises one or more feedback resistors connected between an input and an output of the second stage amplifier.

Also disclosed is a method for variably amplifying a signal comprising receiving a signal and amplifying the signal in a first stage amplifier to create a first amplified signal. Then presenting the first amplified signal to a second stage amplifier and controlling the impedance between the first stage amplifier and the second stage amplifier based on a control signal. The control signal controls the gain of the amplifier. Then amplifying the first amplified signal with a second stage amplifier and outputting the second stage amplifier on an output of the second stage amplifier.

In one embodiment controlling impedance comprising adjusting a resistance between differential signal paths between the first amplifier stage and the second amplifier stage. The control signal may comprise an automatic gain control signal. This method may further comprise controlling the impedance of an output of the second stage amplifier based on a second control signal. Likewise, the method may further comprise monitoring the output of the second stage and creating the control signal and second control signal based on the monitoring. In one embodiment, controlling the impedance comprises providing the control signal to a FET switch.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

The example environment of FIG. 1 is but one possible environment of use and is provided to aid in understanding. It is contemplated that the innovations disclosed herein may be utilized in any environment which would benefit from an accurate and linear TIA amplifier. After reading the following disclosure, one of ordinary skill in the art may determine numerous different environments of use for the disclosed innovations.

Figure 2:
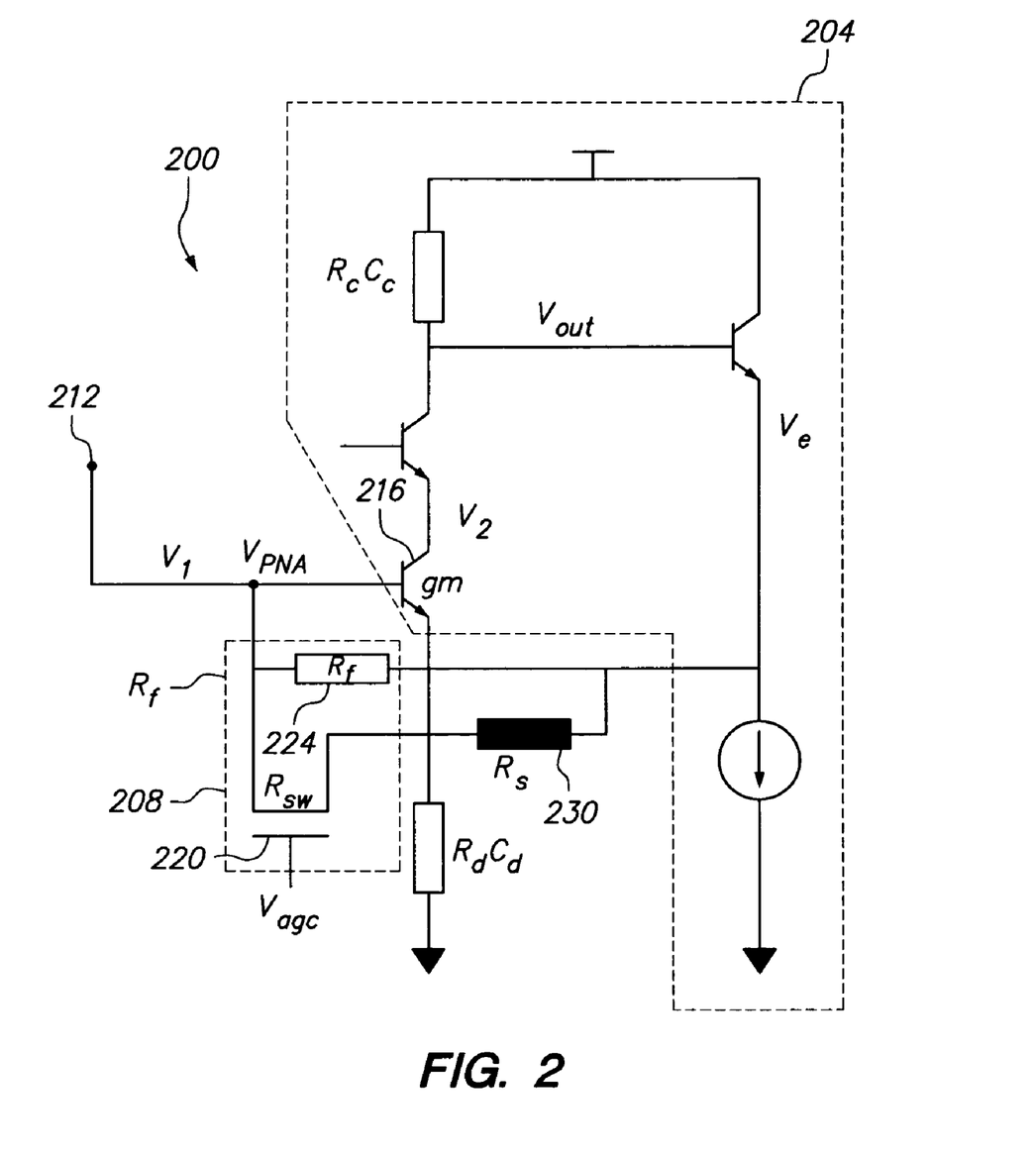
FIG. 2 illustrates a circuit level block diagram with the divider network to address the drawbacks in the prior art.

FIG. 2 illustrates a circuit level block diagram of one innovation to address the drawback in the prior art. This circuit illustrates an exemplary TIA device 200. In general, amplifier element 204 may be broadly described as the amplifier while gain control loop 208 serves as a voltage based automatic gain control. Also part of the embodiment of FIG. 2 is a collector resistor capacitance RcCc and a degeneration resistance capacitance RdCd. These elements are described below in more detail.

In this circuit, an input 212 connects to a transistor 216, which is part of the amplifier element 204. The transistor 216 has a transconductance value defined by $g_m$ and is configured to generate an amplified output at outputs $V_{out}$ and $V_e$.

In operation and in this example environment, the input to the TIA 200 varies with the intensity of the received optical signal and as a result, the input signal swings between low to high current magnitudes. To account for such input swing, a voltage controlled feedback loop 208 provides the amplifier feedback. Part of this loop is a FET switch 220 and a feedback resistor 224. Controlling the FET switch 220 is a control voltage $V_{agc}$, which determines the amount of resistance in the feedback loop 208. By adjusting the resistance in the loop, the amplification of the amplifier element 204 is controlled. Greater amplification is applied to smaller input signals, while amplification is reduced for larger input signals.

A drawback to this configuration is that the FET switch 220 causes unwanted distortion, which if uncorrected can hinder circuit performance. This distortion occurs as a result of the FET resistance ($R_{sw}$) changing in response to voltage changes across the switch. These changes in resistance $R_{sw}$ also change the resistance in the feedback loop, which affects the linearity of signal amplification.

To overcome this drawback, an innovation is disclosed to reduce the effect of the switch resistance $R_{sw}$ on the overall loop by adding divider element 230. The divider element 230 can be any device that establishes a series resistance in the feedback loop. The divider element 230 may be a passive element, active element or a combination of both.

In one embodiment, the divider element 230 comprises one or more fixed resistances. Through voltage division, a portion of the voltage across the feedback loop is expressed across the divider element 230 while a portion is expressed across the FET switch 220. As compared to prior art embodiments which lacked the benefit of element 230, the innovation reduces the voltage swing across the switch 220. As a result, changes in switch resistance $R_{sw}$ have a smaller delta affect on the total resistance across the loop. This in turn reduces the voltage change resulting from changes in $R_{sw}$. Testing including harmonic analysis reveals this divider element 230 improves performance.

Figure 3:
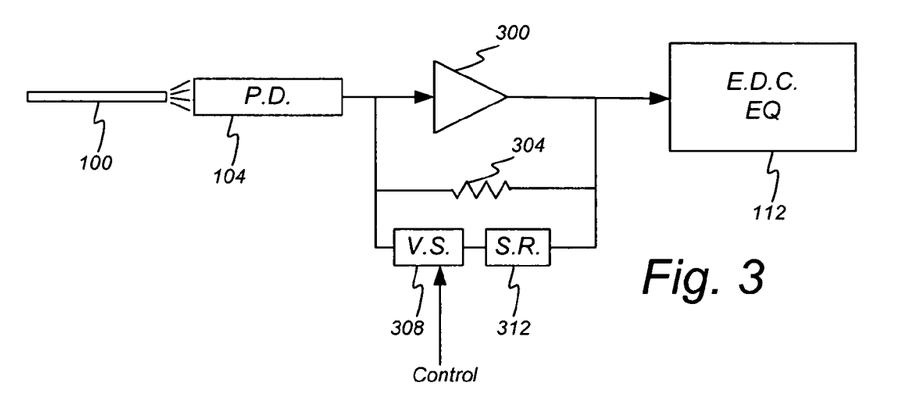
FIG. 3 illustrates a generalized block diagram of a circuit of FIG. 2.

FIG. 3 illustrates a generalized block diagram of the circuit of FIG. 2. In this block diagram, a feedback resistance 304 is in parallel with an amplifier 300. A variable FET resistor switch 308 receives a control input that determines the resistance presented by the switch, which in turn controls the resistance of the feedback loop. A series resistor 312 is also provided in series with the variable switch. The series resistor 312 could be fixed or variable. Operation occurs as described above in connection with FIG. 2. The addition of the series resistance 312 reduces the dominance of the variable switch resistance. This in turn reduces the change in feedback resistance resulting from changes in the resistance of variable switch.

Returning now to FIG. 2, a discussion of the drawbacks and principles of operation of the prior art is provided to aid in understanding of the innovation presented next. As discussed above, the prior art TIA designs had linearity limitations at higher bit rates and when presented with a range of currents, such as 10 micro amps to 1 milliamp. These limitations included introduction of harmonic distortion and clipping. However, applications demand good linearity for low currents to higher currents.

During operation of the prior art TIA, the input current coming in is amplified to give an amplified output. In response to increased current, the voltage swing across feedback resistor becomes larger and this in turn causes distortion or excessive gain.

In response, the $V_{agc}$ value may be increased to lower the feedback resistance value by providing a shunt around the feedback resistor $R_f$ 224. The input to the FET switch 220 is related to the value of the input current. This operation occurs dynamically such that for low input currents, the input to the Vagc magnitude is likewise small. In response to larger input currents it is desired to have smaller feedback resistance. In this manner, the swing across the feedback path is adjusted in an effort to maintain linearity and avoid clipping and distortion.

For the circuit shown in FIG. 2, the FET switch 220 has a resistance $R_{sw}$ defined as follows:

$$R_{sw} = \frac{1}{\beta(V_{agc} - V_{PNA} - V_{ds} - V_T)}$$

As can be seen from this equation, the resistance $R_{sw}$ depends inversely on the input voltage to the FET switch 220. Thus, for larger input currents, the swing across the drain-source terminals $V_{ds}$ affects the switch resistance, which in turn adversely affects the linearity.

The transimpedance of the amplifier is defined by the following equation, where A is the gain of the amplifier and $R'_f$ is the combined feedback of the FET switch 220 $R_{sw}$ and the feedback resistor $R_f$.

$$TZ = \frac{AR'_f}{1+A}$$

In addition, the bandwidth of the TIA is defined as follows, where $C_{pd}$ is the capacitance of the degeneration element.

$$BW = \frac{A}{2\pi R'_f C_{pd}}$$

From these two equations it can be seen that both the transimpedance and the bandwidth are related to $R'_f$ and as such, changes in $R_{sw}$ affects these terms. In summary, as the input signal becomes larger, $V_{agc}$ changes, changing the $R_{sw}$. The swing across the FET switch causes non-constant and non-linear behavior. Consequently, it is desirable to eliminate or minimize the voltage swing across the feedback FET switch.

In addition, transitioning from a low current input to a high current input changes the AC characteristic of amplifier behavior. For example, peaking can cause distortion. Some of these unwanted characteristics flow directly from the AC response of the switch. This is often referred to as the dynamic behavior of the TIA in response to different input currents.

Differing input current levels change the poles and zeros of the amplifiers so caution must be exercised to avoid instability problems. For example, if a TIA is configured to have certain AC response for low current, then in response to increased current, the transimpedance changes. When this occurs, the pole locations move closer in vicinity and this can cause instability due to phase modulations. Any RC combination in the circuit creates a pole or a zero.

In general, it is preferred to avoid positive feedback or unwanted oscillations and in general, negative feedback establishes and promotes stability. In a two pole system, the feedback can be delayed and create uncertain gain levels thereby causing instability.

In the example embodiment of FIG. 2, there exist two primary poles, with the first pole being the dominant pole. The following equations provide a representation for the dominant pole.

$$w_{p1} = \frac{A}{2\pi R'_f C_{PD}}$$

And the second pole is defined as $$w_{p2} = \frac{1}{2\pi R_c C_{ctotal}}$$

Thus, it can be seen that the pole locations depend on $R'_f$ and $R_c$. And, as set forth above, as the input current changes, so does $R'_f$, which causes the pole 1 location to move higher on the pole/zero Bode plot. This can then create instability. Note that pole 2 is dependant on the collector resistance and capacitance and as such, changes in input current will generally not change the pole 2 location.

To overcome the drawbacks of the prior art, it is possible to adjust the gain (A) of the system to maintain separation between the poles or to maintain the pole location constant, and thus maintain stability. Adjusting the gain A may occur in relation to the input current. It is contemplated that the gain may be increased or decreased in relation to the input current to maintain stability. In one embodiment, a decrease in the gain of the amplifier will maintain the separation between the poles. In one embodiment these changes are in the Y domain or gain domain.

The gain of internal amp A is defined as:

$$A = \frac{g_m R_c}{1 + g_m R_d}$$

where $R_c$ is the collector resistance and gm is the transconductance of the transistor which is determined by the transistor dimensions, design, and current. In this embodiment the transistor is a bipolar device, but it is contemplated that in other embodiments the transistor can comprise any process. $R_d$ is the degeneration resistance, which may be assumed to be the emitter resistance of the internal amplifier. Because all these values with the exception of $R_d$ are constants, by changing $R_d$, the gain can be changed. Thus, increasing $R_d$ will decrease the gain A.

Deriving the equations for the gain A and the first pole yields the following relation:

$$w_{p1} = \frac{g_m R_c}{2\pi R'_{f(1+g_m R_d)} C_{PD}}$$

and from this equation it can be seen that the pole location can be maintained if in response to $R'_f$ decreasing, the value for $R_d$ is simultaneously increased. Conversely, increases in $R'_f$ are countered by decreases in $R_d$.

With the assumption that the product of gm and $R_d$ is far greater than unity, further simplification yields:

$$w_{p1} = \frac{R_c}{2\pi R'_f R_d C_P}$$

Therefore, to maintain the pole location and stability, the product $R'_f * R_d$ should be maintained constant. This is true because $R_c$ does not change for a given setting even with input current changes. The only values that change are $R'_f$ and $R_d$. $R'_f$ changes with $R_{sw}$, which changes with input current. Therefore, by adjusting $R_d$ it is possible to control the gain, which maintains system stability.

To implement this innovation, another element or circuit is established. In one embodiment, the product of $R'_f$ and $R_d$ is maintained constant to maintain system stability.

Turning now to the method and apparatus for maintaining $R'_f$ related to $R_d$, one example embodiment is disclosed utilizing a replica circuit.

Figure 4:
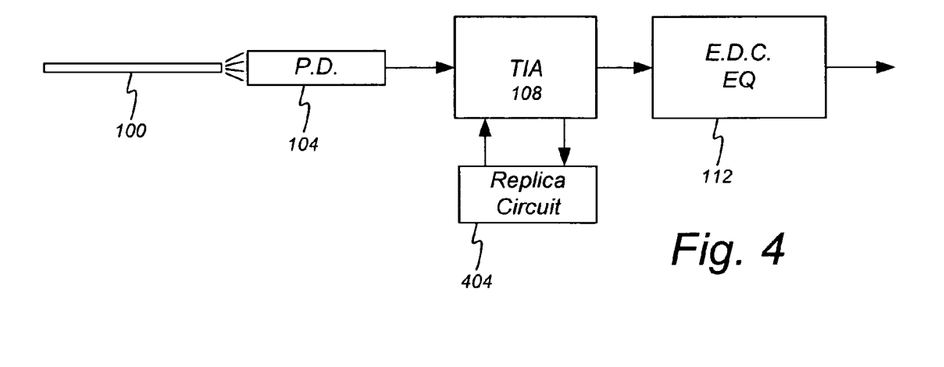
FIG. 4 illustrates a block diagram of an example embodiment of a system having a replica circuit.

FIG. 4 illustrates on example embodiment of such an exemplary system. FIG. 4 is similar to FIG. 1, and only the aspects of FIG. 4 which differ from FIG. 1 are discussed herein. In contrast to FIG. 1, FIG. 4 includes a replica circuit 404. The replica circuit is configured to maintain a value $R_d$ in relation to the value $R'_f$, thereby maintaining the product of the two at or near a constant value. In turn and as discussed above, stability is maintained.

It is contemplated that the replica circuit comprises any configuration of hardware or software and may include active devices, passive devices, or both. The term replica circuit indicates that one or more aspects of the TIA circuit 108 are duplicated to create a circuit that behaves and reacts to inputs and environmental conditions in a manner similar to the TIA itself.

Figure 5:
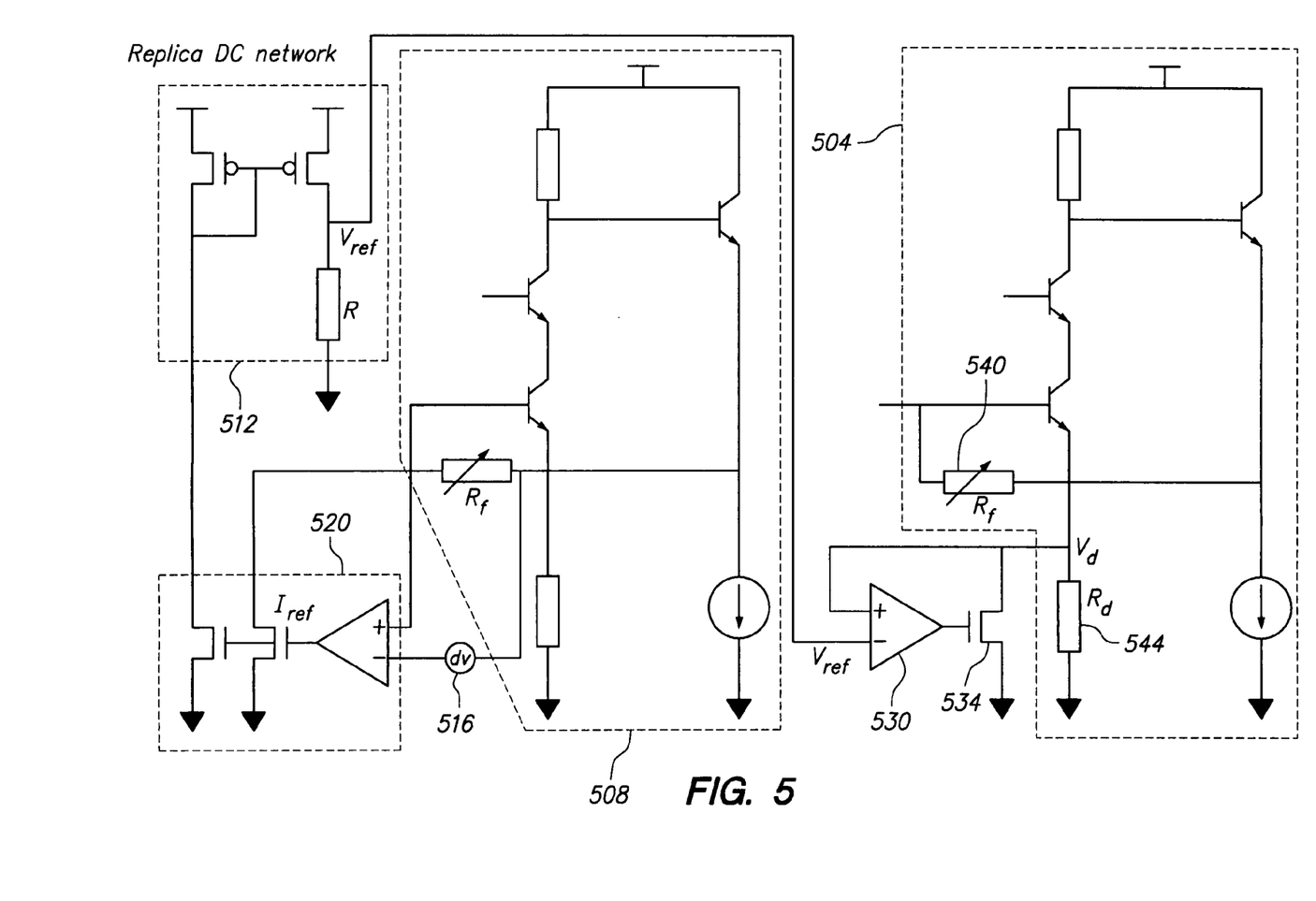
FIG. 5 illustrates a circuit diagram of an example implementation of a transimpedance amplifier with a replica circuit.

FIG. 5 illustrates a circuit diagram of an example implementation of a replica circuit. This is but one possible example embodiment of a replica circuit and as such it is contemplated that one of ordinary skill in the art may generate variations on this circuit that do not depart from the claims that follow.

In this example circuit, the original TIA 504 is shown with $R'_f$ and $R_d$ shown for purposes of reference. Replicating this circuit is a replica circuit 508. Replica circuit 508 is generally similar to the TIA circuit 504. The replica circuit may be larger, smaller, or the same size as the TIA circuit 504. In one embodiment, the replica circuit 508 is a scaled down version of the TIA 504. By replicating the TIA, process is matched for both circuits during creation. As a result, instead of tapping into a node of the TIA 504, which changes the behavior of the TIA, a replica 508 is created which behaves similarly over process, temperature and bias currents. The replica 508 generates generally identical or similar node voltage and current flows, or a scaled version thereof, as in the TIA 504.

A constant voltage source 516 is applied to the replica circuit $R_f$ and the resulting current is provided to an amplifier circuit 520, which extracts the current. The resulting current is mirrored by current mirror 512 to create a reference voltage. The current mirror may be a 1:1 ratio or other ratio. This reference voltage is provided as an input to an amplifier 530. This reference voltage is related to $R_f$ of the replica circuit. The other input to the amplifier 530 is a negative feedback from a switch 534. In this embodiment the switch 534 comprises a FET switch.

In operation, the TIA 504 reacts to changes in input current is as commonly understood which in turn change the value of $R'_f$ 540. To maintain a desired relationship between $R'_f$ 540 and Rd 544 a replica circuit 508 is provided. Due to the duplicate nature of the replica circuit 508, the value of $R'_f$ in the replica circuit is likewise changing in relation to $R'_f$ 540.

Across $R'_f$ in the replica circuit a constant voltage is provided from voltage source 516. The resulting current is provided to the amplifier circuit 520 to create $I_{ref}$, which is in turn mirrored by current mirror circuit 512 to create a reference voltage as shown. The reference voltage is input to the amplifier 530 to generate an output that controls switch 534. The switch 534 controls the resistance $R_d$. Stated another way, a replica circuit is created to detect voltage across $R_f$ replica (which indicates $R_f$ of the TIA) and this detected voltage is processed and used to control a switch which changes $R_d$. Thus, the resistance $R_d$ is controlled to inversely match the change in $R'_f$ 540 to thereby maintain the product of $R'_f$ and $R_d$ as generally constant.

Equations can be used to better illustrate these relationships. The value $V_{ref}$ can be expressed as follows:

$$V_{ref} = I_{ref}R = \frac{\Delta v}{R_f}R$$

Thus, $I_{ref}$ is related to $V_{ref}$ and $V_{ref}$ is related to or based on the changing value $R_f$. Furthermore, $$\frac{V_{ref,max}}{V_{ref,min}} = \frac{V_{d,max}}{V_{d,min}} = \frac{R_{f\,max}}{R_{f\,min}}$$

which shows that $V_{ref}$ is related to $V_d$ and $R_f$ and it is possible to create a $V_{ref}$ that is inversely proportional to $R'_f$. In addition, it can be established that $I_d$ through $R_d$ is roughly a constant. The amplifier 530 can be created to establish $V_d$ and $V_{ref}$ the same. As such, then $$R_d = \frac{V_{ref}}{I_d} = \frac{\left(\frac{\Delta v}{R_f}\right)R}{I_d}$$

and deriving this further yields, $$R_d R_f = \frac{V_k R}{I_d}$$

where the right hand side of this equation is a constant. Hence, it is shown that $R_d$ times $R_f$ is constant as desired to maintain stability.

Also disclosed herein is a method and apparatus for increasing the bandwidth of an amplifier system, without degrading gain and dynamic range. As is understood, it is preferred for an amplifier to have a high gain, wide or high bandwidth, large dynamic range and minimal peaking at lower gain. Prior art solutions were able to improve one of these performance aspects, at the expense of other aspects.

Figure 6:
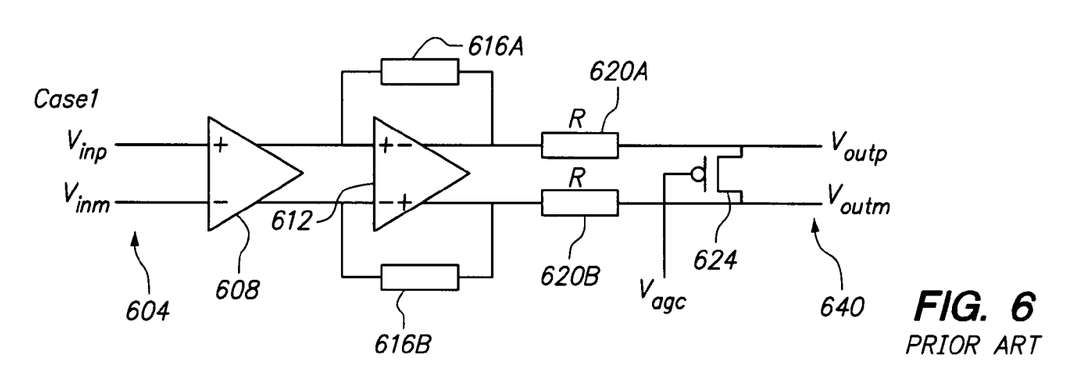
FIG. 6 illustrates an example embodiment of a prior art amplifier utilizing a prior art solution for increasing dynamic range.

FIG. 6 illustrates on example embodiment of a prior art amplifier utilizing a prior art solution for increasing bandwidth. In this prior art embodiment, inputs 604 $V_{inp}$ and $V_{inm}$ connect to a first stage amplifier 608, the output of which connects to a second stage amplifier 612. Feedback resistors 616A, 616B connect as shown to provide feedback to the second stage amplifier 612. The outputs from the second stage amplifier 612 connect to resistors R 620A, 620B, and the opposing ends of the resistors 620A, 620B connect to the drain and source of an FET switch 624. The gate of the FET switch 624 is controlled by an automatic gain control voltage, defined as $V_{agc}$. The resulting voltage is provided on outputs 640 as $V_{outp}$ and $V_{outm}$.

In operation, an input voltage on input 604 is amplified by the first stage amplifier 608 and the second stage amplifier 612. The control voltage Vagc controls the gain between the input 604 and the outputs 640. When presented with higher frequency signals, the resistors 620 and FET switch 624 appear as an RC element which lowers the bandwidth due to the capacitance of the switch 624 which appears as a low pass filter.

Figure 7:
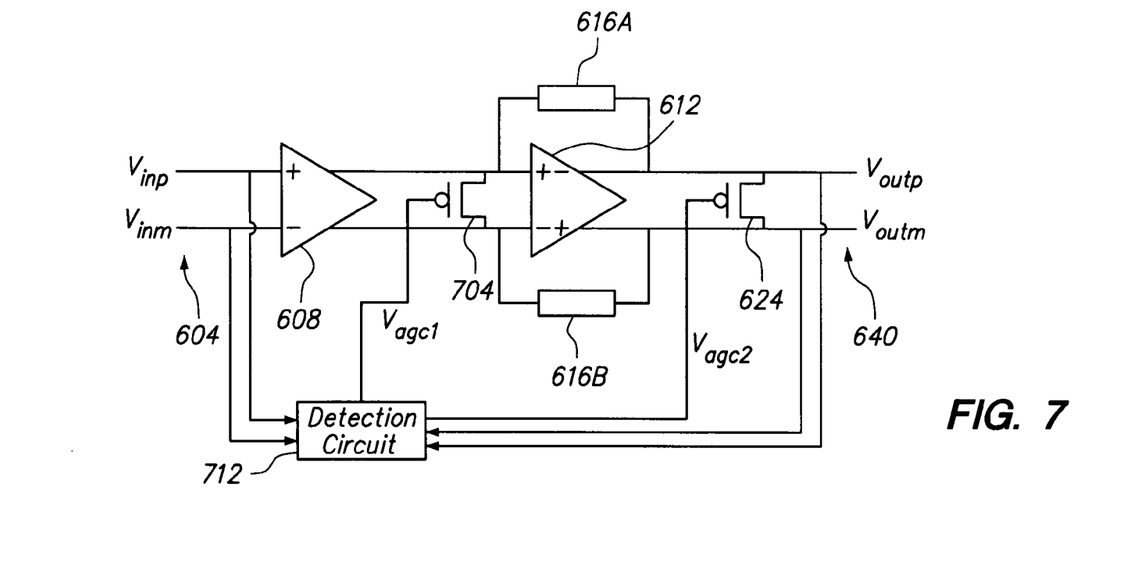
FIG. 7 illustrates an amplifier having multiple automatic gain control elements with modified resistive network.

To overcome the drawbacks of the prior art, it is proposed to eliminate the resistors 620 and add another switch to the system of FIG. 6. This new example embodiment is shown in FIG. 7. The elements of FIG. 7 which are generally similar to the elements of FIG. 6 are not discussed again. In this embodiment, the output of the second stage amplifier 612 connects directly to the source and drain of the second FET switch 624 and form the outputs 640. In addition, a first FET switch 704 is connected across the output and input of the first stage amplifier 608 and the second stage amplifier 612 as shown. In this embodiment, control voltages $V_{agc1}$ and $V_{agc2}$ control the FET switches respectively.

In operation, the control voltages $V_{agc1}$, $V_{agc2}$ are presented to the gate terminals to create two independent terminals to control the dynamic range. As such, by increasing the value of $V_{agc1}$, such as for example near $V_{dd}$, the FET switch 704, in this embodiment a P channel FET, results in no effect on the incoming signal and the level of amplification. Presented with a high value of $V_{agc1}$, the FET appears as an open circuit.

As $V_{agc1}$ is decreased, the FET switch turns on and reaches a linear region resulting in its source to drain resistance decreasing. As this occurs, the switch 704 appears to have control over the input and output impedance of the amplifiers 608 and 612. This in turn reduces gain and as such, the $V_{agc1}$ signal controls gain.

When analyzing dynamic range, the focus is on large signals. Typically it is desired to have a lower gain when presented with a large input signal to avoid saturation. By lowering the values of $V_{agc1}$ and $V_{agc2}$, the output impedances of the first and second stages are reduced. By having two $V_{agc}$ controls, the effect is multiplicative and it is possible to obtain a larger dynamic range.

The control voltages $V_{agc1}$ and $V_{agc2}$ are generated by a detection circuit 712. The detection circuit may comprise any combination of hardware, software, or both configured to monitor and process the incoming signal, the outgoing signal, or both to generate the control signals $V_{agc1}$ and $V_{agc2}$. It is contemplated that peak detection or magnitude monitoring may occur as part of the detection operation.

In one embodiment, the values for $V_{outp}$ and $V_{outm}$ are feedback to the detection circuit 712. In such an embodiment, averaging or peak detection occurs and the result is subtracted or compared to a threshold. If the result is higher than the threshold, then one or more $V_{agc}$ values are adjusted to maintain the output within a desired range.

Figure 8:
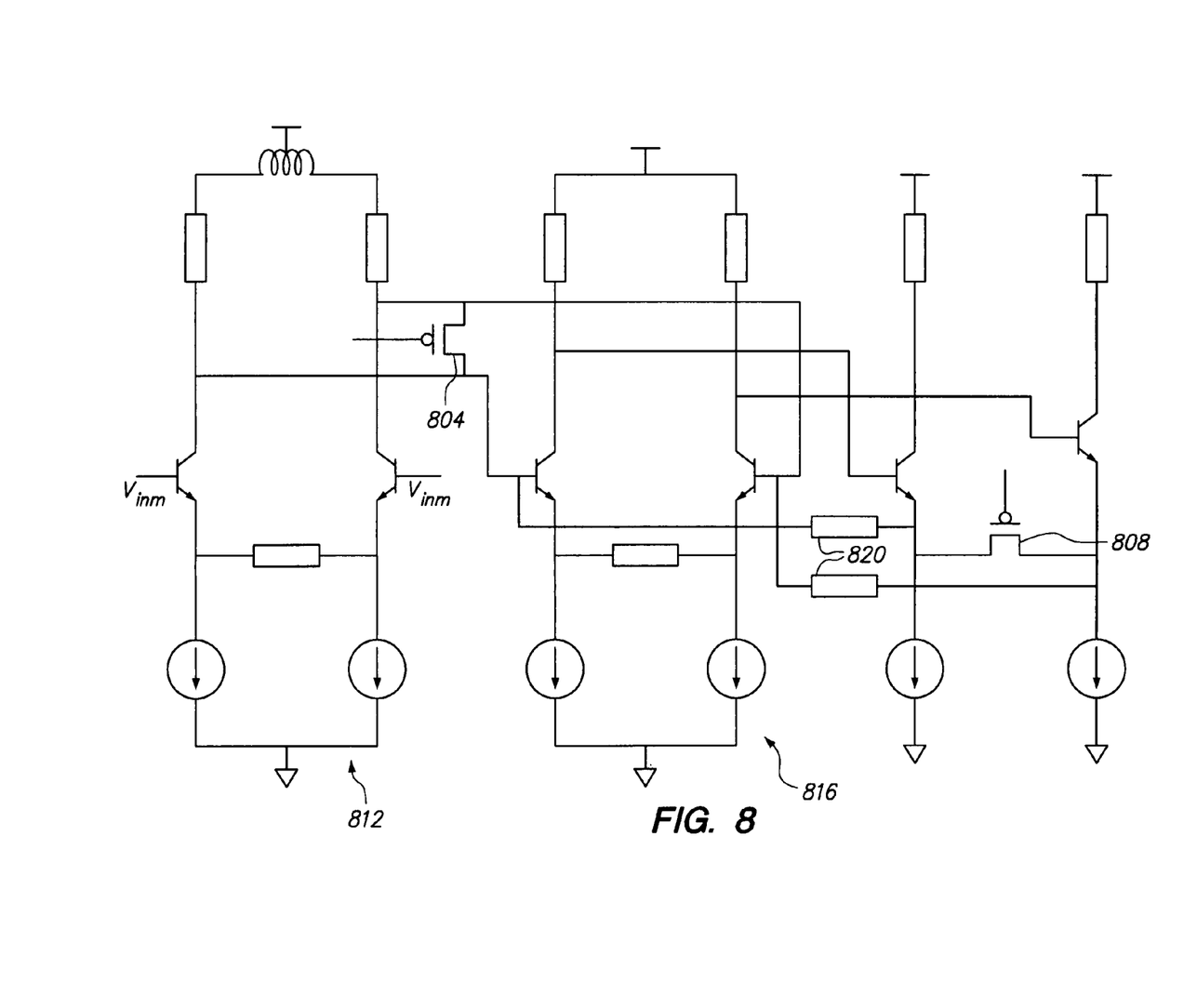
FIG. 8 illustrates an example circuit level diagram of the generalized block diagram of FIG. 7.

FIG. 8 illustrates one example circuit level diagram of the generalized block diagram of FIG. 7. In this example embodiment, the FET 804 comprises the first FET switch and the FET 808 comprises the second FET switch. The first amplifier stage is shown as a differential amplifier by current mirror 812 while the second gain stage is shown as a differential amplifier by the second current mirror 816. The resistors 820 represent resistors 616 in FIG. 7. This is but one example embodiment of a circuit level implementation and as such, it is contemplated that other circuit arrangements are possible based on this disclosure. For example, it is contemplated that these principles maybe implemented in TIA, equalizers, limiting amplifiers, crosspoint switches, or any other application benefiting from one or more of increased bandwidth, gain, stability, and dynamic range and limited peaking, and variable gain amplifiers (VGAs).

The following table sets forth simulation results for the innovation set forth herein.

| Comparison Table | Prior Art Approach (R = 100 ohms) | Prior Art Approach (R = 35 ohms) | Prior Art Approach (R = 18 ohms) | Current Approach |
|---|---|---|---|---|
| Gain | 9.64 dB | 9.64 dB | 9.64 dB | 9.5 dB |
| Bandwidth | 2.1 GHz | 11.78 GHz | 12.7 GHz | 12.78 GHz |
| Dynamic Rang | 18.53 dB | 12.01 dB | 9.2 dB | 19.12 dB |
| Peaking at Lower Gain | 9 db worst case | — | — | 2.76 dB worst case. |

As can be seen from this table, the bandwidth of the prior art approach is only 2.1 GHz, which does not approach the higher bandwidths, such as 10 GHz. As a result, the prior art does not meet specification. In the prior art, the resistance value may be lowered, as shown when R=18 ohms, but this degrades the dynamic range. The current approach, shown in the final column and as disclosed herein achieves the desired bandwidth around 12.78 GHz. In addition, the other factors are not degraded as would normally occur in prior art approaches. For example, the gain is maintained and the dynamic range actually increases to 19.12 db. Finally, peaking is also improved.

It is further contemplated that even though the current approach disclosed herein is presented with a focus on a linear amplifier, it can be extended to limiting applications as well to achieve the bandwidth and dynamic range by changing the values of one or more components. For example, the value of Rs (see FIG. 2) may be reduced or varied to perform in such an environment.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An amplifier comprising:
   a first stage amplifier having one or more first stage inputs and one or more first stage outputs;
   a second stage amplifier having one or more second stage inputs and one or more second stage outputs, wherein one or more second stage inputs connect to the one or more first stage outputs;
   one or more impedance matching devices at the output of one or more of the first stage amplifier and second stage amplifier, wherein the one or more impedance matching devices have impedance controlled by one or more control signals;
   a detection system configured to:
      monitor an input to the first stage amplifier input or an amplified signal from the first stage amplifier or the second stage amplifier, and
      generate, based on the monitoring, one or more control signals to control the resistance of the one or more impedance matching devices.

2. The amplifier of claim 1, further comprising a feedback resistor between a second stage input and a second stage output.

3. The amplifier of claim 1, wherein the impedance matching devices comprise FET switches.

4. The amplifier of claim 1, wherein the one or more impedance matching devices comprises a first impedance matching device between the first stage amplifier and a second stage amplifier and a second impedance matching device at the one or more second stage outputs.

5. The amplifier of claim 1, wherein the one or more control signals comprise one or more automatic gain control signals.

6. The amplifier of claim 1, wherein at least one of the one or more impedance matching device adjust the impedance between the first stage amplifier and the second stage amplifier.

7. A two stage amplifier comprising
   a first stage amplifier and a second stage amplifier, wherein the output of the first stage amplifier connects to the input of the second stage amplifier;
   a variable impedance matching device between the first stage amplifier and the second stage amplifier, the variable impedance matching device having an impedance controlled by a control signal received by the variable impedance matching device;
   a detection circuit configured to detect a peak power level or average power level from a signal output from the two stage amplifier and based on the detection, generate the control signal.

8. The amplifier of claim 7, wherein the variable impedance matching device comprises a FET switch.

9. The amplifier of claim 8, wherein the second stage amplifier has differential inputs and the FET switch is connected between the differential inputs and the control signal changes the resistance of the FET switch.

10. The amplifier of claim 7, further comprising a second variable impedance matching device at the output of the second stage amplifier and the detection circuit further outputs a second control signal to the second variable impedance matching device.

11. The amplifier of claim 7, further comprising one or more feedback resistors connected between an input and an output of the second stage amplifier.

12. The amplifier of claim 7, wherein the control signal comprises an automatic gain control signal.

13. A method for variably amplifying a signal in an amplifier having a first stage amplifier and a second stage amplifier comprising:
   receiving a signal;
   amplifying the signal in the first stage amplifier to create a first amplified signal;
   presenting the first amplified signal to the second stage amplifier;
   controlling the impedance between the first stage amplifier and the second stage amplifier based on a control signal, wherein the control signal controls the gain of the amplifier;
   amplifying the first amplified signal with the second stage amplifier to create a second stage amplifier signal; and
   outputting the second stage amplifier signal on an output of the second stage amplifier.

14. The method of claim 13, wherein controlling impedance comprising adjusting a resistance between differential signal paths between the first amplifier stage and the second amplifier stage.

15. The method of claim 13, wherein the control signal comprises an automatic gain control signal.

16. The method of claim 13, further comprising controlling the impedance of an output of the second stage amplifier based on a second control signal.

17. The method of claim 16, further comprising monitoring the output of the second stage and creating the control signal and second control signal based on the monitoring.

18. The method of claim 13, wherein controlling the impedance comprises providing the control signal to a FET switch.

* * * * *